United States Patent
Dasgupta (10) Patent No.: US 6,194,966 B1
(45) Date of Patent: Feb. 27, 2001

(54) CMOS CLASS AB OPERATIONAL AMPLIFIER OPERATING FROM A SINGLE 1.5V CELL

(75) Inventor: Uday Dasgupta, Singapore (SG)

(73) Assignee: Tritech Microelectronics, Ltd., Singapore (SG)

( * ) Notice: Subject to any disclaimer, the term of this patent is extended or adjusted under 35 U.S.C. 154(b) by 0 days.

(21) Appl. No.: 09/249,253

(22) Filed: Feb. 12, 1999

(51) Int. Cl.⁷ ........................................ H03F 3/26
(52) U.S. Cl. .................. 330/267; 330/253; 330/255; 330/265
(58) Field of Search ................... 330/253, 255, 330/259, 267, 265; 327/563

(56) References Cited

U.S. PATENT DOCUMENTS

| 4,555,623 | 11/1985 | Bridgewater et al. | 250/214 |
|---|---|---|---|
| 5,057,789 | 10/1991 | Nagaraj | 330/264 |
| 5,568,093 | 10/1996 | Holzer | 330/264 |
| 5,900,780 | * 5/1999 | Hirose et al. | 330/255 |
| 5,933,055 | * 8/1999 | Dosho | 330/255 |
| 5,977,829 | * 11/1999 | Wells | 330/267 |

* cited by examiner

*Primary Examiner*—Michael B Shingleton
(74) *Attorney, Agent, or Firm*—George O. Saile; Stephen B. Ackerman (57) ABSTRACT

A method and circuits are disclosed for an operational amplifier operating from a single cell 1.5 Volt supply which consumes very little power, and which can handle rail-to-rail input common mode and output signal swings. Low voltage and low power operation are made possible by biasing the CMOS transistors of the entire operational amplifier in the so called "sub-threshold" or "weak inversion" region of operation. This lowers $V_{GSN}$ and $V_{GSP}$ below $V_{TN}$ and $V_{TP}$, and also lowers $V_{Dsat}$ so that the operational amplifier can operate down to 0.9 Volt. The Class AB control circuit part of the operational amplifier can be applied to any conventional (normal biasing—other than weak inversion) low voltage Class AB output stage. The output stage of the operational amplifier is designed to source and sink more than 60 microAmperes of current into a 10 Kohm load while consuming only 4 micoramperes of current in the quiescent state.

22 Claims, 5 Drawing Sheets

CMOS CLASS AB OPERATIONAL AMPLIFIER OPERATING FROM A SINGLE 1.5V CELL

BACKGROUND OF THE INVENTION

1. Field of the Invention

The invention relates to the field of operational amplifier integrated circuits, and more particularly to a method and a circuit to operate a CMOS operational amplifier from a single 1.5V cell by biasing the transistors of the operational amplifier in the sub-threshold or weak inversion region of operation, in addition the class AB control circuit is novel and can be applied to any conventional low voltage Class AB output stage.

2. Description of the Related Art

Operational amplifiers (op amps) operating from a single cell must be designed with low voltage circuitry consuming very little power. It is difficult to have 1.5V operation in conventional CMOS processes using enhancement mode devices. This is because the minimum supply voltage required for rail to rail input common mode range is $V_{GSN}+V_{GSP}+2V_{Dsat}=0.7+0.8+2\times0.2=1.9V$. $V_{GSN}$ and $V_{GSP}$ are the gate source voltages for a NMOS and PMOS, respectively. These are typically 200 mV higher than $V_{TN}$ (=0.5V) and $V_{TP}$ (=0.6V) which are the threshold voltages of the NMOS and PMOS devices, respectively. $V_{Dsat}$ is the drain current saturation voltage of either NMOS or PMOS. The values specified are for a typical 0.25 um CMOS process.

Several solutions to the above problems associated with providing the weak inversion mode or low quiescent current have been proposed in the related art.

U.S. Pat. No. 5,568,093 (Holzer) discloses a Class AB amplifier using transistors operating in weak inversion mode. However, the application (amplifying a crystal oscillator output to CMOS logic levels) and, therefore, the disclosed circuit differs from the invention.

U.S. Pat. No. 5,057,789 (Nagaraj) describes a Class AB CMOS amplifier with low quiescent current but higher supply voltages are used.

U.S. Pat. No. 4,555,623 (Bridgewater et al.) shows a pre-amplifier for a focal plane detector array in which the devices are operated in a weak inversion region, but the circuit disclosed differs markedly from the invention.

It should be noted that none of the above-cited examples of the related art provide the combination of low voltage, low current consumption, high output current Class AB operational amplifier operating in weak inversion mode.

The invention overcomes the above problem by biasing the transistors in the so called "sub-threshold" or "weak inversion" region of operation. This lowers $V_{GSN}$ and $V_{GSP}$ to typically 200 mV below $V_{TN}$ and $V_{TP}$ and $V_{Dsat}$ to less than 100 mV. Therefore, the Op. Amp. can operate down to $0.3+0.4+2\times0.1=0.9V$. In addition, the sub-threshold operation results in a very low operating current. The invention describes an operational amplifier operating with a single 1.5V cell with a class AB output stage. Consuming only about 4 microAmpere ($\mu A$) in the quiescent state, it can source and sink more than 60 uA into a 10K load resistance handling rail to rail input common mode and output signal swings. The class AB control circuit is novel and can be applied to any conventional (normal biasing—other than weak inversion) low voltage Class AB output stages.

SUMMARY OF THE INVENTION

It is an object of the present invention to provide a method and a circuit that offers an operational amplifier operating from a single cell 1.5 Volt supply which consumes very little power, and which can handle rail-to-rail input common mode and output signal swings.

Another object of the present invention is to provide a Class AB control circuit which can be applied to any conventional (normal biasing—other than weak inversion) low voltage Class AB output stage.

A further object of the present invention is to provide an operational amplifier whose output stage can source and sink more than 60 microAmperes of current into a 10 Kohm load with a quiescent current as low as 4 $\mu A$ from a 1.5 Volt battery cell.

These objects have been achieved by biasing the transistors of the entire operational amplifier in the so called "subthreshold" or "weak inversion" region of operation. This lowers $V_{GSN}$ and $V_{GSP}$ below $V_{TN}$ and $V_{TP}$, and also lowers $V_{Dsat}$ so that the operational amplifier (op amp) can operate down to 0.9 Volt. The sub-threshold operation also results in a very low operating current.

DESCRIPTION OF THE PREFERRED EMBODIMENT

Figure 1:
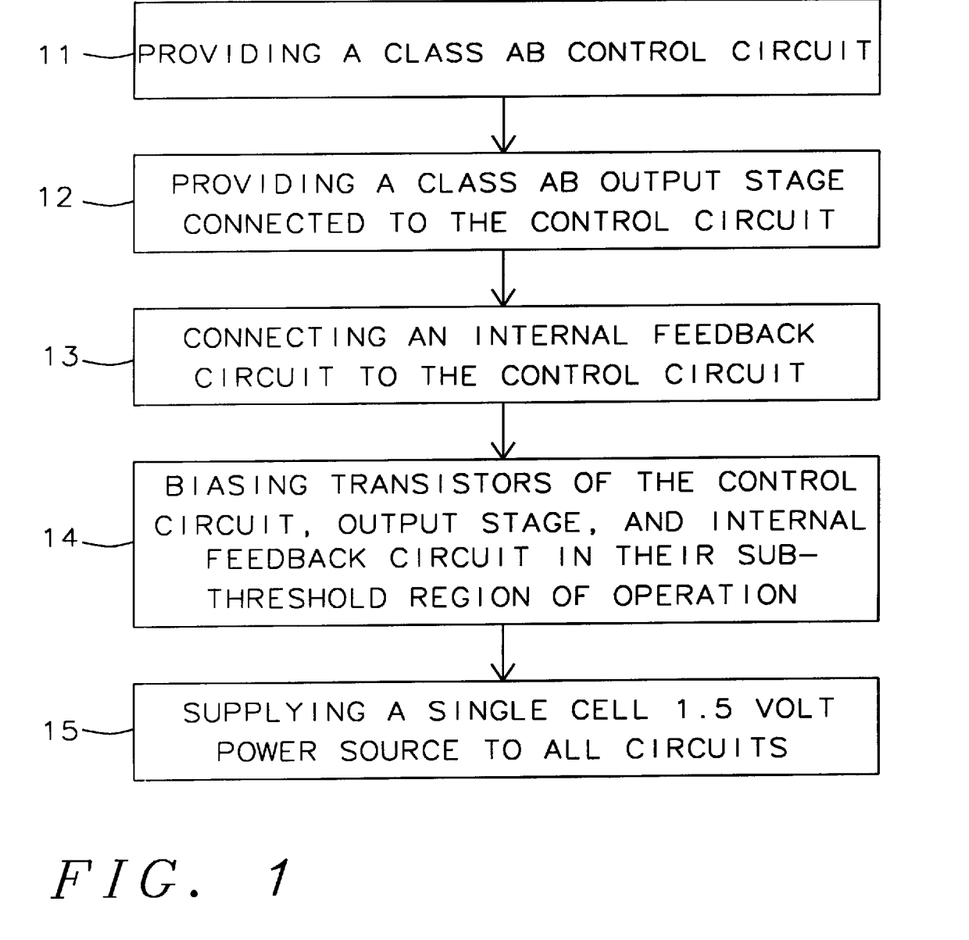
FIG. 1 is a block diagram of the method of the present invention.

Referring now to FIG. 1, we begin a description of the method of the present invention.

The method of operating an operational amplifier (op amp) from a single 1.5V power supply is shown in FIG. 1, and consists of these steps:

Block 11 provides a class AB control circuit having a plus and minus input and accepting rail-to-rail input common-mode swings, where the control circuit produces a drive current for a subsequent class AB output stage.

Block 12 provides the aforementioned class AB output stage which is connected to the control circuit of Block 11. The output stage delivers a rail-to-rail output signal swing to an external load through p-channel and n-channel output transistors.

Block 13 connects an internal feedback circuit to the control circuit, the internal feedback circuit setting up DC voltages for the control circuit to maintain quiescent currents at a small known value in the output transistors of the output stage.

Block 14 biases transistors of the control circuit, the output stage, and the internal feedback circuit in their sub-threshold, also called weak inversion, region of operation, allowing the use of a single cell 1.5 Volt power source for all circuits, Block 15.

N-channel transistors operating in the sub-threshold region have a gate-to-source voltage $V_{GSN}$ of 0.3 Volt, this voltage, however, may range from 0.27 to 0.33 Volt.

P-channel transistors operating int the sub-threshold region have a gate-to-source voltage $V_{GSP}$ of 0.4 Volt, this voltage, however, may range from 0.36 to 0.44 Volt.

The saturation voltage $V_{Dsat}$ for these p-channel and n-channel transistors is 80 mV, but may range from 72 to 88 mV.

The power supply operating range of the disclosed operational amplifier ranges from 0.8 to 2.8 Volt. Note that the above values are representative of a 25 μm CMOS process.

Figure 2:
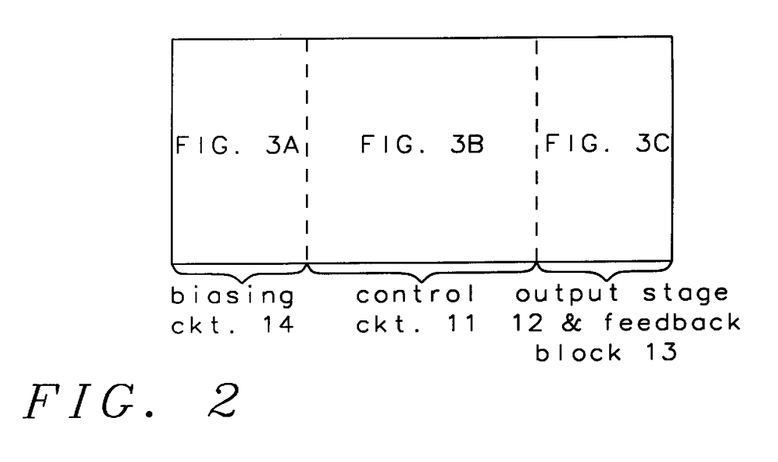
FIG. 2 is a block overview of the circuits of the present invention.
Figure 3A:
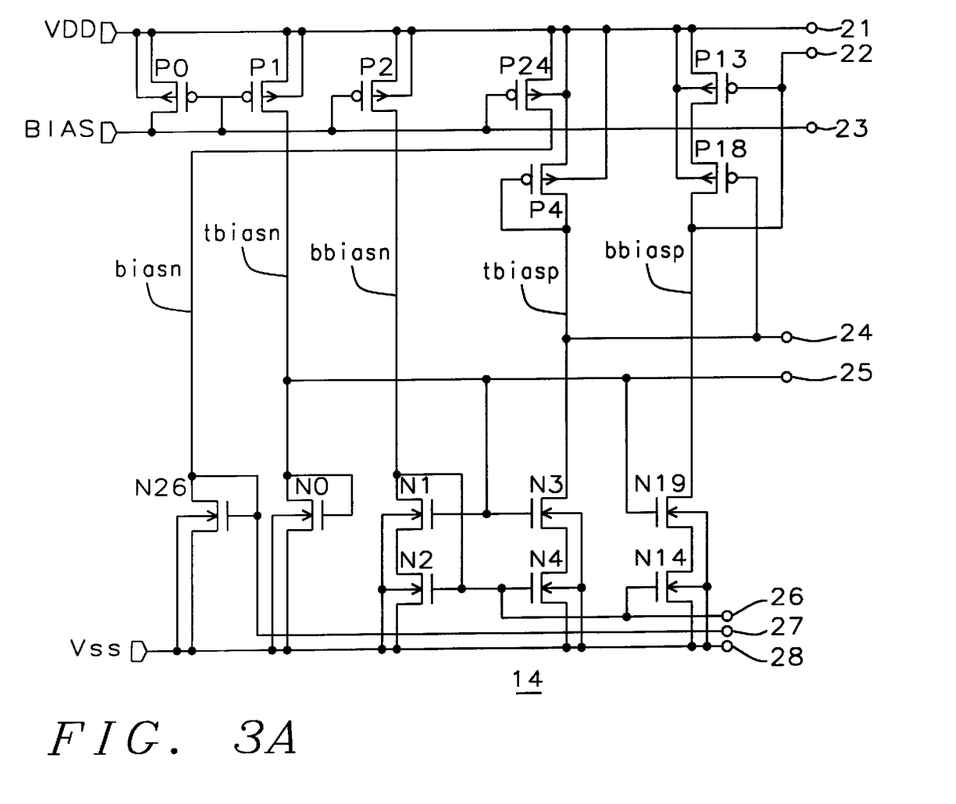
FIG. 3A is a detailed circuit diagram of the biasing circuit of FIG. 2.
Figure 3B:
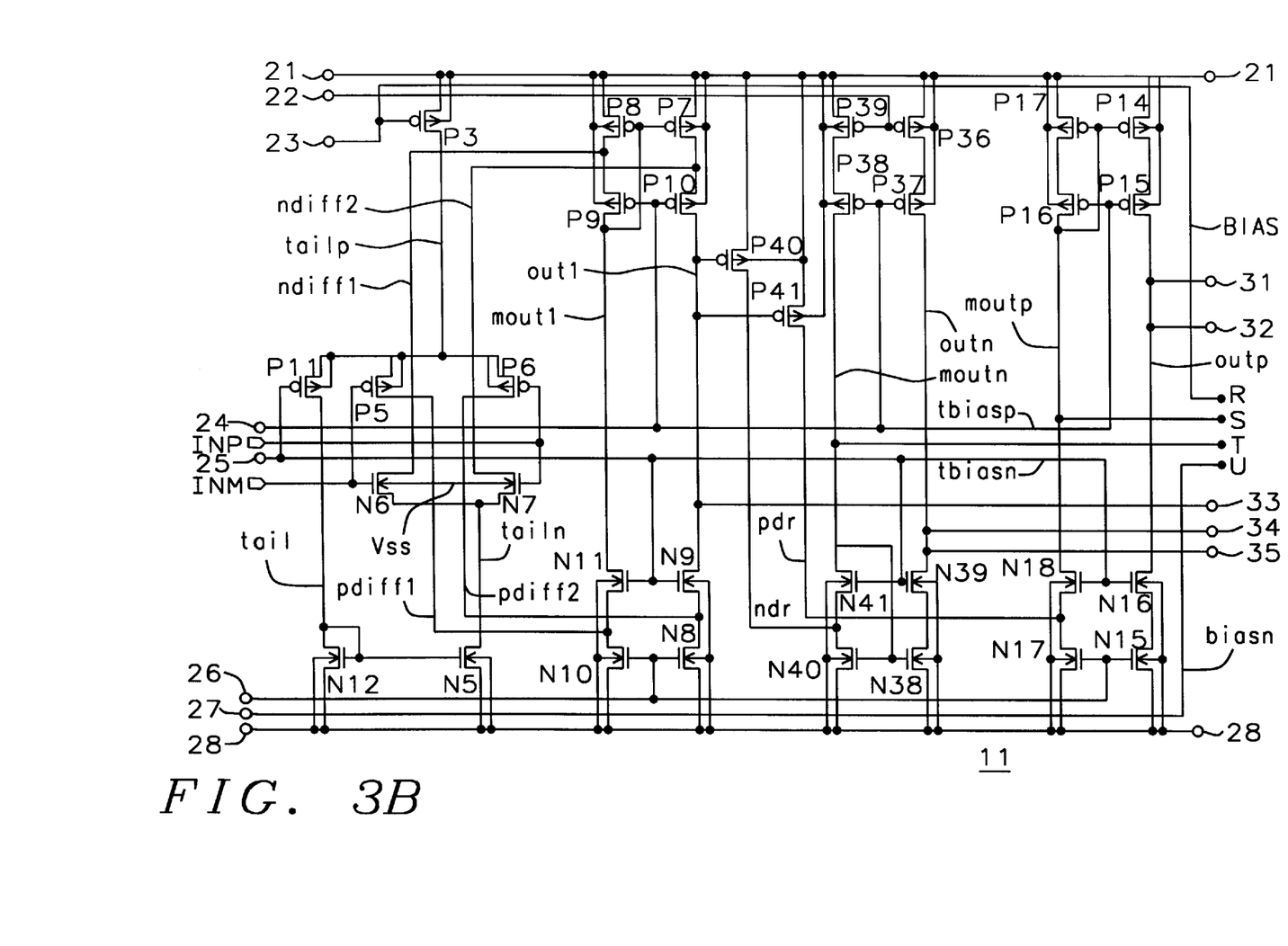
FIG. 3B is a detailed circuit diagram of the control circuit of FIG. 2.
Figure 3C:
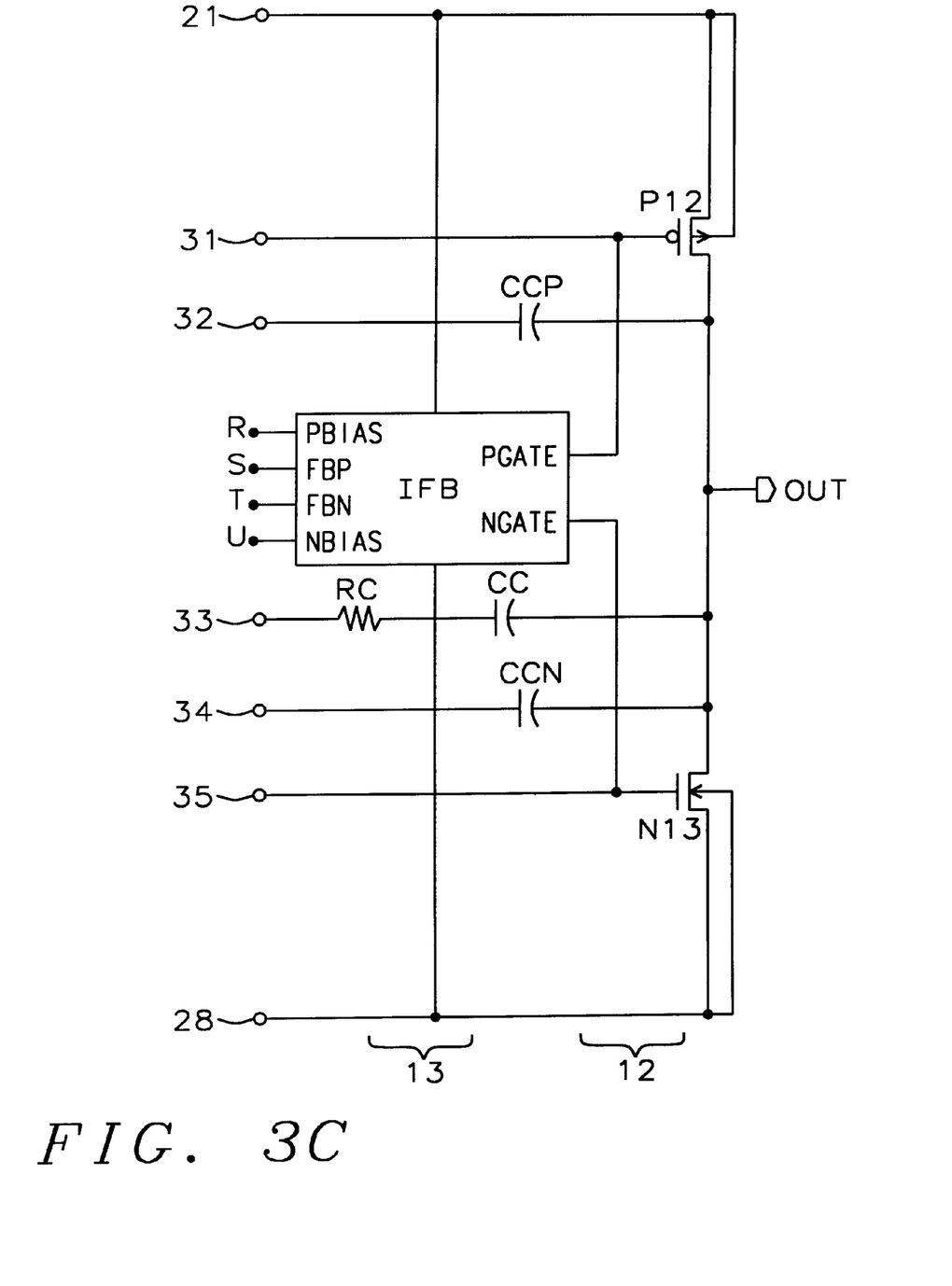
FIG. 3C is a detailed circuit diagram of the output stage and a block diagram of the internal feedback circuit 'IFB' of FIG. 2.
Figure 4:
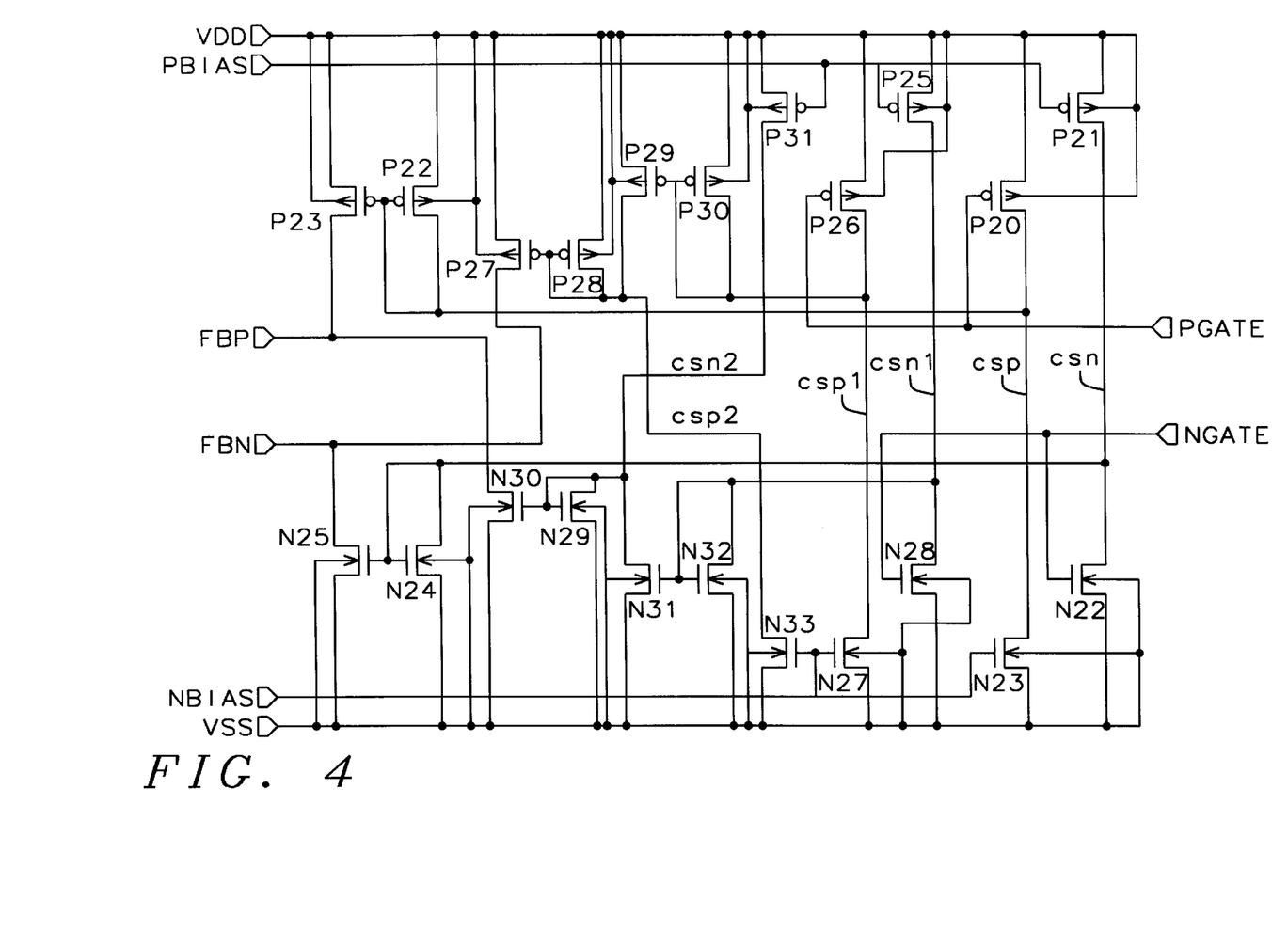
FIG. 4 is a circuit diagram of the block diagram of the internal feedback circuit 'IFB' of FIG. 3C.

FIG. 2 illustrates how the circuit of the present invention is sectioned into FIGS. 3A, 3B, and 3C, where FIG. 3A depicts biasing circuit 14, FIG. 3B depicts control circuit 11, and FIG. 3C depicts class AB output stage 12 and the block the diagram of feedback circuit 13. Connections between the FIGS. 3A, 3B, and 3C are indicated by like numerals from 21 to 28, 31 to 35, and letters R, S, T, and U. The circuit diagram of feedback block 13 is shown in FIG. 4. Note that p-channel transistors P0, P1, P2, P4, P13, P18, P24, and n-channel transistors N0–N4, N14, N19, N26 are depicted in FIG. 3A, and that p-channel transistor P12, n-channel transistor N13, resistor RC, and capacitors CCN, CC, and CCP (output stage 12) are depicted in FIG. 3C. Transistors for feedback circuit 13 of FIG. 3C are depicted in FIG. 4. All other transistors are part of control circuit 11 and are depicted in FIG. 3B.

The entire circuit of FIG. 2 is biased by biasing circuit 14 of FIG. 3A in the subthreshold region by a current source from node 'bias' to node 'vss' which sets up current in transistor P0. Transistor clusters N1, N3, N19; N11, N9; N41, N39; N18, N16 are biased by DC voltage at the node 'tbiasn' formed by transistor N0 with P1 mirroring the current of P0. Similarly transistor clusters P18; P9, P10; P38, P37; P16, P15 are biased by the DC voltage at the node 'tbiasp' formed by transistor P4, and P2 and the cascode mirror formed by N1, N3, N2, N4 mirroring the current of P0. The DC voltage at the node 'bbiasn' formed by N1 and N2 with P2 biases the clusters N4, N14; N10, N8; N17, N15. Similarly, the DC voltage at the node 'bbiasp' formed by P18 and P13 with N19 and N14 biases the pair P39, P36.

P3 mirroring the current of P0 forms the tail current source of the P-Channel differential input pair P5, P6. P11 steers the current in P3 into N5, the tail transistor of the N-Channel differential pair N6, N7, with the help of the mirror transistor N12. The gate of P11 is biased to 'tbiasn', so the above steering takes place when the 'common mode' or the DC value of the differential input at 'inp' and 'inm' goes above the DC voltage at 'tbiasn'. Therefore, for an input 'common mode' voltage above this DC voltage, only the N-Channel pair is active and below it, only the P-Channel pair is active. In this manner a rail to rail input swing could be achieved as only that input pair which works properly near the respective power rail is selected, while others turn off. Again, as the entire biasing of the transistors is in the subthreshold region, the input pair transconductance is directly proportional to the bias current. Therefore, with the change of the 'common mode' voltage of the input signal and the consequent interchange of the tail current between the two input differential pairs no change is created in the net transconductance of the input stage.

Both input differential pairs convert the differential input voltage at 'inp' and 'inm' into current and drive it into the cascode current mirror load formed by N11, N9, N10, N8 which serve as the current sources and where P9, P10, P8, P7 serve as the mirror. The load transforms the current from the input differential pairs into voltage, which is available at node 'out1', the output of the first stage of the operational amplifier.

In a manner similar to the first stage, P40 converts the signal voltage at 'out1' into current and feeds it into the cascode current mirror load formed by P38, P37, P39, P36 working as the current sources, and N41, N39, N40, N38 as the current mirror. The output of this second stage of the operational amplifier driving the N-Channel output device N13 is available at the node 'outn'.

The operational amplifier has a parallel second stage to drive the P-Channel output device P12 independently. P41 converts the signal voltage at 'out1' in to current and feeds it into the cascode current mirror load formed by N18, N16, N17, N15 working as the current sources and P16, P15, P17, P14 as the current mirror. The output of this second stage of the operational amplifier is available at node 'outp'. Signals at 'outp' and 'outn' are designed to work in phase with each other.

Internal feedback circuit 13 (Block 'IFB') helps to set the DC voltages at 'outp' and 'outn' by feeding back a current derived from a fraction of the currents in the output devices P12 and N13 in an appropriate manner so as to maintain their quiescent currents at a small known value. This helps in obtaining good efficiency and, at the same time, low crossover distortion. The block 'IFB' takes in signals at 'outp' and 'outn' for current sensing of P12 and N13, respectively. It also takes in DC voltages at 'bias' and 'biasn' in the main or control circuit 11 via its nodes 'pbias' and 'nbias' for biasing of P-Channel and N-channel devices, respectively. The DC voltage at 'biasn' in the main or control circuit is formed by N26 with P24 mirroring the current of P0. The DC voltage at 'bias' is formed by P0 with the externally supplied bias current. The block 'IFB' outputs currents to nodes 'moutp' and 'moutn' in order to adjust the DC voltages at 'outp' and 'outn' respectively. The block 'IFB' also shares the same power supply nodes 'vdd' and 'vss' as the main circuit.

CCP, CCN and CC are capacitors of a Nested Miller compensation scheme employed here. The first two capacitors take care of the two high impedance output nodes 'outp' and 'outn' of the two parallel second stages respectively. The last capacitor takes care of the high impedance output node 'out1' of the first stage. The resistor RC introduces a zero in conjunction with CC, thus allowing a lag-lead type of compensation, thus improving bandwidth.

In block 'IFB', the transistor N22 senses the current in the output transistor N13 in the main circuit as the gate source voltage of the two transistors is the same. Under quiescent conditions, N22 carries one-tenth the current of N13, if its aspect ratio is designed to be ten times smaller. N22 is fed by the current source P21 biased from node 'bias' in the main circuit. The value of the current in P21 is adjusted, in this case, to one-tenth the desired value of the quiescent current in N13. If the current in the output transistor N13 reduces below its quiescent value, the current in N22, which is normally equal to that in P21, reduces proportionately. N24 then carries the difference current and this is mirrored out through N25 to the input node 'moutn' of the current mirror load driving N13 in the main circuit. The current mirror load responds by adjusting its output node 'outn' to move it to a higher potential which, in turn, results in an increase of current in N13. Therefore, the feedback circuit formed by P21, N22, N24 and N25 prevents the current in the output transistor N13 to go below its desired quiescent current value.

In a similar fashion, the feedback circuit formed by N23 (biased from node 'biasn' in the main circuit), P20, P22 and P23 provides the same function for the output transistor P12 in the main circuit. However, if the currents in P12 and N13 go above the quiescent value, the two circuits described above cannot do anything as they simply shut off.

N28 has the same function as N22 and is fed by the current source P25 that carries under quiescent conditions twice the current of N28 and P21. The excess current, which is the same as that in P21, flows into N32 and then is mirrored into N31 where it is subtracted from an equal amount of current supplied by the current source P31. When the current in the output transistor N13 increases above its quiescent value, the current in N32 and, therefore, that in N31 reduces. The difference current of P31 and N31 flows into N29 and this is mirrored by N30 to feed the input node 'moutp' of the current mirror load driving P12 in the main circuit. In response, the current mirror load adjusts its output node 'outp' to move to a higher potential, thereby reducing the current in P12 till it reaches its quiescent value. In short, the feedback circuit comprising P25, N28, N32, N31, N29, N30 and P31 brings the current in the output transistor P12 down to its quiescent value if the current in the other output transistor N13 rises above its quiescent value.

In a similar manner, the feedback circuit comprising N27, P26, P30, P29, P28, P27 and N33 brings the current in the output transistor N13 down to its quiescent value if the current in the other output transistor P12 rises above its quiescent value. These two feedback circuits switch off if the currents in P12 or N13 go below their quiescent value.

When there is no signal input, i.e. the differential voltage across nodes 'inp' and 'inm' is zero, the current in the output transistors P12 and N13 must be the same as there is no current delivered to the load. The load is connected from the output node 'out' to the analog ground or the 'common mode' voltage. Considering the operation of the two pairs of feedback circuits, as described above, we can come to the following conclusion: The DC voltages at the nodes 'outp' and 'outn' will be adjusted such that each of the output transistors P12 and N13 will carry a quiescent current which is equal to ten times the currents in either P21 or N23. This condition is also valid for small differential input signals.

When there is a large positive differential signal across 'inp' and 'inm', 'outp' will move to a lower potential. As a result, current in P12 will increase whereas the current in N13 will reduce to almost its quiescent value. Therefore, the excess current from P12 will be passed to the load and the voltage across it will increase, as this is a source current. Similarly, when there is a large negative differential signal across 'inp' and 'inm', 'outn' will move to a higher potential. As a result, current in N13 will increase, whereas the current in P12 will reduce to almost its quiescent value. Therefore, the excess current from N13 will be passed to the load and the voltage across it will reduce, as this is a sink current.

The sizes of N25 and P27 are so adjusted that while handling a large positive differential input signal, N25 is able to sink the entire current delivered from P27 and, at the same time, the currents in N24 and N22 are not much affected. Similarly, the sizes of P23 and N30 are so adjusted that while handling a large negative differential input signal, P23 is able to source the entire current required by N30 and, at the same time, the currents in P22 and P20 are not much affected.

It is interesting to note that the output transistors P12 and N13 are biased in weak inversion in the quiescent mode. But they move to the strong inversion mode while delivering high currents into the load.

Referring now again to FIGS. 2 and 4, we give a more detailed description of the circuit of the operational amplifier utilizing a single 1.5V power supply. This supply may range from 0.8 to 2.8 Volt and typically uses 4 microampere in the quiescent state, this value may, however, range from 3 to 5 microAmperes. The operational amplifier can source or sink a current of typically 60 microAmperes, but depending on the size of the chosen output transistors may range from 30 to 100 microAmperes. The operational amplifier uses a voltage rail vdd and a reference rail vss for all its subsequently described parts.

The control circuit 11 part of the operational amplifier comprises:

p-channel transistor P0, the source-drain of transistor P0 connected between the voltage rail and input 'bias' and the gate of transistor P0 connected to input 'bias', where transistor P0 acts as current source;

p-channel transistor P1 and n-channel transistor N0 connected in series between the voltage rail and the reference rail, the gate of transistor P1 connected to input 'bias', and the gate of transistor N0 connected to the junction of transistor P1 and transistor N0, that junction labeled 'tbiasn';

p-channel transistor P2, an n-channel transistor N1, and an n-channel transistor N2 all connected in series between the voltage rail and the reference rail, the gate of transistor P2 connected to input 'bias', the gate of transistor N1 connected to junction 'tbiasn', and the gate of transistor N2 connected to the junction of transistor P2 and transistor N1, that junction labeled 'bbiasn';

a p-channel transistor P24 and an n-channel transistor N26 connected in series between the voltage rail and the reference rail, the gate of transistor P24 connected to input 'bias', and the gate of transistor N26 connected to output 'biasn', output 'biasn' forming the junction of transistor P24 and transistor N26;

p-channel transistor P4, an n-channel transistor N3, and an n-channel transistor N4 all connected in series between the voltage rail and the reference rail, the gate of transistor P4 connected to the junction of transistor P4 and transistor N3, that junction labeled 'tbiasp', the gate of transistor N3 connected to junction 'tbiasn', and the gate of transistor N4 connected to junction 'bbiasn';

p-channel transistor P13, a p-channel transistor P18, an n-channel transistor N19, and an n-channel transistor N14 all connected in series between the voltage rail and the reference rail, the gate of transistor P13 connected to the junction of transistor P18 and transistor N19, that junction labeled 'bbiasp', the gate of transistor P18 connected to junction 'tbiasp', the gate of transistor N19 connected to junction 'tbiasn', and the gate of transistor N14 connected to junction 'bbiasn';

p-channel transistor P3, a p-channel transistor P11, and an n-channel transistor N12 connected in series between the voltage rail and reference rail, the junction between transistor P3 and transistor P11 labeled 'tailp', the junction between transistor P11 and transistor N12 labeled 'tail', the gate of transistor P3 connected to input 'bias', the gate of transistor P11 connected to junction 'tbiasn', the substrate of transistor P11 connected to junction 'tailp', and the gate of transistor N12 connected to junction 'tail';

p-channel transistor P8, a p-channel transistor P9, an n-channel transistor N11, and an n-channel transistor N10 all connected in series between the voltage rail and the reference rail, the gate of transistor P8 connected to the junction of transistor P9 and transistor N11, that junction labeled 'mout1', the gate of transistor P9 connected to junction 'tbiasp', the gate of transistor N11 connected to junction 'tbiasn', and the gate of transistor N10 connected to junction 'bbiasn', the junction between transistor P8 and transistor P9 labeled 'ndiff1', and the junction between transistor N11 and transistor N10 labeled 'pdiff1';

p-channel transistor P7, a p-channel transistor P10, an n-channel transistor N9, and an n-channel transistor N8 all connected in series between the voltage rail and the reference rail, the gate of transistor P7 connected to junction 'mout1', the gate of transistor P10 connected to junction 'tbiasp', the gate of transistor N9 connected to junction 'tbiasn', and the gate of transistor N8 connected to junction 'bbiasn', the junction between transistor P7 and transistor P10 labeled 'ndiff2', the junction between transistor N9 and transistor N8 labeled 'pdiff2', and output 'out1' forming the junction between transistor P10 and transistor N9;

input p-channel transistor P5 having its source-drain connected between junctions 'tailp' and 'pdiff1', the substrate of transistor P5 connected to junction 'tailp', and its gate connected to differential input 'inm';

input p-channel transistor P6 having its source-drain connected between junctions 'tailp' and 'pdiff2', the substrate of transistor P6 connected to junction 'tailp', and its gate connected to differential input 'inm';

input n-channel transistor N6 having its drain-source connected between junctions 'ndiff1' and 'tailn', and its gate connected to differential input 'inm';

input n-channel transistor N7 having its drain-source connected between junctions 'ndiff2' and 'tailn', and its gate connected to differential input 'inp';

p-channel transistor P39, a p-channel transistor P38, an n-channel transistor N41, and an n-channel transistor N40 all connected in series between the voltage rail and the reference rail, the gate of transistor P39 connected to junction 'bbiasp', the gate of transistor P38 connected to junction 'tbiasp', the gate of transistor N41 connected to junction 'tbiasn', the gate of transistor N40 connected to the junction between transistor P38 and transistor N41 labeled junction 'moutn', and the junction between transistor N41 and transistor N40 labeled 'ndr';

p-channel transistor P36, a p-channel transistor P37, an n-channel transistor N39, and an n-channel transistor N38 all connected in series between the voltage rail and the reference rail, the gate of transistor P36 connected to junction 'bbiasp', the gate of transistor P37 connected to junction 'tbiasp', the gate of transistor N39 connected to junction 'tbiasn', the gate of transistor N38 connected to junction 'moutn', and output 'outn' forming the junction between transistor P37 and transistor N39;

p-channel transistor P17, a p-channel transistor P16, an n-channel transistor N18, and an n-channel transistor N17 all connected in series between the voltage rail and the reference rail, the gate of transistor P17 connected to the junction of transistor P16 and transistor N18, that junction labeled 'moutp', the gate of transistor P16 connected to junction 'tbiasp', the gate of transistor N18 connected to junction 'tbiasn', and the gate of transistor N17 connected to junction 'bbiasn', and the junction between transistor N18 and transistor N17 labeled 'pdr';

p-channel transistor P14, a p-channel transistor P15, an n-channel transistor N16, and an n-channel transistor N15 all connected in series between the voltage rail and the reference rail, the gate of transistor P14 connected to junction 'moutp', the gate of transistor P15 connected to junction 'tbiasp', the gate of transistor N16 connected to junction 'tbiasn', and the gate of transistor N15 connected to junction 'bbiasn', and where output 'outp' forms the junction between transistor P15 and transistor N16;

p-channel transistor P40 having its source-drain connected between the voltage rail and junction 'ndr', and the gate of transistor P40 connected to output 'out1'; and lastly p-channel transistor P41 having its source-drain connected between the voltage rail and junction 'pdr', and the gate of transistor P41 connected to output 'out1'.

Output stage 12 of the operational amplifier comprises:

p-channel output transistor, labeled P12, and n-channel output transistor, labeled N13, connected in series between the voltage rail and the reference rail, and output 'out' forming the junction between transistor P12 and transistor N13, the gate of transistor P12 connected to output 'outp' of the control circuit, the gate of transistor N13 connected to output 'outn' of the control circuit, the first capacitor, labeled CCP, connected between output 'outp' and output 'out', the second capacitor, labeled CCN, connected between output 'outn' and output 'out', and a resistor, labeled RC, and the third capacitor, labeled CC, connected in series between output 'out1' and output 'out'.

The internal feedback circuit 13 of the operational amplifier comprises:

input 'pgate' connected to output 'outp' of the control circuit;

input 'ngate' connected to output 'outn' of the control circuit;

input 'pbias' connected to input 'bias' of the control circuit;

input 'nbias' connected to output 'biasn' of the control circuit;

output 'fbp' connected to junction 'moutp' of the control circuit;

output 'fbn' connected to junction 'moutn' of the control circuit;

p-channel transistor P21 connected in series with n-channel transistor N22 between voltage rail vdd and reference rail vss, the gate of transistor P21 connected to input 'pbias', the gate of transistor N22 connected to input 'ngate', the junction between transistor P21 and transistor N22 labeled 'csn';

p-channel transistor P20 connected in series with n-channel transistor N23 between the voltage rail and the reference rail, the gate of transistor P20 connected to input 'pgate', the gate of transistor N23 connected to input 'nbias', the junction between transistor P20 and transistor N23 labeled 'csp';

p-channel transistor P25 connected in series with n-channel transistor N28 between the voltage rail and the reference rail, the gate of transistor P25 connected to input 'pbias', the gate of transistor N28 connected to input 'ngate', the junction between transistor P25 and transistor N28 labeled 'csn1';

p-channel transistor P26 connected in series with n-channel transistor N27 between the voltage rail and the reference rail, the gate of transistor P26 connected to input 'pgate', the gate of transistor N27 connected to input 'nbias', the junction between transistor P26 and transistor N27 labeled 'csp1';

p-channel transistor P31 connected in series with n-channel transistor N31 between the voltage rail and the reference rail, the gate of transistor P31 connected to input 'pbias', the gate of transistor N31 connected to junction 'csn1', the junction between transistor P31 and transistor N31 labeled 'csn2;' n-channel transistor N32 connected between junction 'csn1' and the reference rail, and the gate of transistor N32 connected to junction 'csn1';

p-channel transistor P29 connected in series with n-channel transistor N33 between the voltage rail and the reference rail, the gate of transistor P29 connected to junction 'csp1', the gate of transistor N33 connected to input 'nbias', the junction between transistor P29 and transistor N33 labeled 'csp2';

p-channel transistor P30 connected between the voltage rail and junction 'csp1', and the gate of transistor P30 connected to junction 'csp1';

p-channel transistor P27 connected in series with n-channel transistor N25 between the voltage rail and the reference rail, the gate of transistor P27 connected to junction 'csp2', the gate of transistor N25 connected to junction 'csn', output 'fbn' forming the junction between transistor P27 and transistor N25;

p-channel transistor P28 connected between the voltage rail and junction 'csp2', and the gate of transistor P28 connected to junction 'csp2';

n-channel transistor N24 connected between junction 'csn' and the reference rail, and the gate of transistor N24 connected to junction 'csn';

p-channel transistor P23 connected in series with n-channel transistor N30 between the voltage rail and the reference rail, the gate of transistor P23 connected to junction 'csp', the gate of transistor N30 connected to junction 'csn2', output 'fbp' forming the junction between transistor P23 and transistor N30;

p-channel transistor P22 connected between the voltage rail and junction 'csp', and the gate of transistor P22 connected to junction 'csp'; and lastly n-channel transistor N29 connected between junction 'csn2' and the reference rail, and the gate of transistor N29 connected to junction 'csn2'.

The proposed invention provides advantages such as a low voltage supply from a single 1.5V cell, very low operating current of 4 microAmpere while able to source and sink more than 60 microAmpere into a 10 Kohm load. The internal feedback circuit 'IFB' maintains the transistors of output stage 12 at a small known quiescent current to obtain good efficiency and low crossover distortion in these output transistors. In addition the class AB control circuit is novel and can be applied to any conventional low voltage class AB output stage.

While the invention has been particularly shown and described with reference to the preferred embodiments thereof, it will be understood by those skilled in the art that various changes in form and details may be made without departing from the spirit and scope of the invention.

What is claimed is:

1. A method of operating an operational amplifier from a single 1.5V power supply, comprising the steps of:

providing a class AB control circuit having a plus and minus input and accepting rail-to-rail input common-mode swings, said control circuit producing a drive current for a class AB output stage;

providing said class AB output stage connected to said control circuit, said output stage delivering rail-to-rail output signal swings to an external load through p-channel and n-channel output transistors;

connecting an internal feedback circuit to said control circuit, said internal feedback circuit setting up DC voltages for said control circuit to maintain quiescent currents at a small known value in said output transistors of said output stage;

biasing transistors of said control circuit, said output stage, and said internal feedback circuit in their sub-threshold, also called weak inversion, region of operation; and operating said operational amplifier from said single 1.5V power supply, where said power supply can drop to a voltage as low as 0.8 volt.

2. The method of claim 1, wherein a gate-to-source voltage $V_{GSN}$ for said n-channel transistors ranges from 0.27 to 0.33 Volt when said n-channel transistors are implemented in a 0.25 micrometer CMOS process.

3. The method of claim 1, wherein a gate-to-source voltage $V_{GSP}$ for said p-channel transistors ranges from 0.36 to 0.44 Volt when said p-channel transistors are implemented in a 0.25 micrometer CMOS process.

4. The method of claim 1, wherein a saturation voltage $V_{Dsat}$ for said p-channel and said n-channel transistors ranges from 72 to 88 mV when said transistors are implemented in a 0.25 micrometer CMOS process.

5. The method of claim 1, wherein said operational amplifier can be operated from a power supply ranging from 0.8 to 2.8 Volt when said operational amplifier is implemented in a 0.25 micrometer CMOS process.

6. An operational amplifier utilizing a single 1.5V power supply, comprising:

a voltage supply;

transistors biased in their sub-threshold, also called weak inversion, region of operation;

a class AB control circuit having a plus and minus input with a rail-to-rail common mode swing, a current source input, said control circuit delivering an amplified input signal to a class AB output stage, said control circuit comprising p-channel and n-channel transistors;

said class AB output stage with inputs and an output, said inputs of said output stage connected to said control circuit, said output of said output stage delivering current to drive an external load, said output stage comprising a p-channel and n-channel output transistor, said transistors of said output stage moving from weak inversion in a quiescent state to strong inversion when delivering high currents to said external load; and an internal feedback circuit connected to said control circuit, said internal feedback circuit setting up DC voltages for said control circuit to maintain quiescent currents at a small known value in said output transistors of said output stage, said internal feedback circuit comprising p-channel and n-channel transistors.

7. The circuit of claim 6, wherein a gate-to-source voltage $V_{GSN}$ for said n-channel transistors ranges from 0.27 to 0.33 Volt.

8. The circuit of claim 6, wherein a gate-to-source voltage $V_{GSP}$ for said p-channel transistors ranges from 0.36 to 0.44 Volt.

9. The circuit of claim 6, wherein a saturation voltage $V_{Dsat}$ for said p-channel and said n-channel transistors ranges from 72 to 88 mV.

10. The circuit of claim 6, wherein said voltage supply ranges from 0.8 to 2.8 Volt.

11. An operational amplifier utilizing a single 1.5V power supply, comprising:

a voltage rail vdd;

a reference rail vss;

transistors biased in their sub-threshold, also called weak inversion, region of operation;

a class AB control circuit having a differential input and applying an input signal with a rail-to-rail common mode swing to that differential input, a current source input, said control circuit delivering an amplified input signal to a class AB output stage, said control circuit comprising a plurality of p-channel and n-channel transistors, and said control circuit connected to said voltage rail vdd and said reference rail vss;

said class AB output stage with inputs and an output, said inputs of said output stage connected to said control circuit, said output of said output stage delivering current to drive an external load, said output stage comprising a p-channel and n-channel output transistor, a resistor and a first, a second, and a third capacitor, said output stage connected to said voltage rail vdd and said reference rail vss, said transistors of said output stage moving from weak inversion in a quiescent state to strong inversion when delivering high currents to said external load; and an internal feedback circuit connected to said control circuit, said internal feedback circuit setting up DC voltages for said control circuit to maintain quiescent currents at a small known value in said output transistors of said output stage, said internal feedback circuit comprising a plurality of p-channel and n-channel transistors, and said internal feedback circuit connected to said voltage rail vdd and said reference rail vss.

12. The circuit of claim 11, wherein said quiescent current ranges from 3 to 5 microAmperes.

13. The circuit of claim 11, wherein a gate-to-source voltage $V_{GSN}$ for said n-channel transistors ranges from 0.27 to 0.33 Volt.

14. The circuit of claim 11, wherein a gate-to-source voltage $V_{GSP}$ for said p-channel transistors ranges from 0.36 to 0.44 Volt.

15. The circuit of claim 11, wherein a saturation voltage $V_{Dsat}$ for said p-channel and said n-channel transistors ranges from 72 to 88 mV.

16. The circuit of claim 11, wherein said voltage rail supplies a potential ranging from 0.8 to 2.8 Volt.

17. The circuit of claim 11, wherein said operational amplifier consumes a current ranging from 3 to 5 microAmperes in the quiescent state.

18. The circuit of claim 11, wherein said operational amplifier can source a current ranging from 30 to 100 microAmperes into a 10 Kohm load.

19. The circuit of claim 11, wherein said operational amplifier can sink a current ranging from 30 to 100 microAmperes inot a 10 Kohm load.

20. The circuit of claim 11, wherein said control circuit comprises:

said input 'bias' connected to an external current source, and said differential inputs 'inp' and 'inm';

outputs 'biasn', 'out1', 'outp', and 'outn';

p-channel transistors each having a source-drain path, a substrate, and a gate;

n-channel transistors each having a drain-source path, a substrate, and a gate;

a p-channel transistor P0, said source-drain of said transistor P0 connected between said voltage rail and said input 'bias' and the gate of said transistor P0 connected to said input 'bias', said transistor P0 acting as current source;

a p-channel transistor P1 and an n-channel transistor N0 connected in series between said voltage rail and said reference rail, the gate of said transistor P1 connected to said input 'bias', and the gate of said transistor N0 connected to the junction of said transistor P1 and transistor N0, said junction labeled 'tbiasn';

a p-channel transistor P2, an n-channel transistor N1, and an n-channel transistor N2 all connected in series, in the sequence recited, between said voltage rail and said reference rail, the gate of said transistor P2 connected to said input 'bias', the gate of said transistor N1 connected to said junction 'tbiasn', and the gate of said transistor N2 connected to the junction of said transistor P2 and transistor N1, said junction labeled 'bbiasn';

a p-channel transistor P24 and an n-channel transistor N26 connected in series between said voltage rail and said reference rail, the gate of said transistor P24 connected to said input 'bias', and the gate of said transistor N26 connected to said output 'biasn', said output 'biasn' forming the junction of said transistor P24 and transistor N26;

a p-channel transistor P4, an n-channel transistor N3, and an n-channel transistor N4 all connected in series, in the sequence recited, between said voltage rail and said reference rail, the gate of said transistor P4 connected to the junction of said transistor P4 and said transistor N3, said junction labeled 'tbiasp', the gate of said transistor N3 connected to said junction 'tbiasn', and the gate of said transistor N4 connected to said junction 'bbiasn';

a p-channel transistor P13, a p-channel transistor P18, an n-channel transistor N19, and an n-channel transistor N14 all connected in series, in the sequence recited, between said voltage rail and said reference rail, the gate of said transistor P13 connected to the junction of said transistor P18 and said transistor N19, said junction labeled 'bbiasp', the gate of said transistor P18 connected to said junction 'tbiasp', the gate of said transistor N19 connected to said junction 'tbiasn', and the gate of said transistor N14 connected to said junction 'bbiasn';

a p-channel transistor P3, a p-channel transistor P11, and an n-channel transistor N12 connected in series, in the sequence recited, between said voltage rail and said reference rail, the junction between said transistor P3 and said transistor P11 labeled 'tailp', the junction between said transistor P11 and said transistor N12 labeled 'tail', the gate of said transistor P3 connected to said input 'bias', the gate of said transistor P11 connected to said junction 'tbiasn', the substrate of said transistor P11 connected to said junction 'tailp', and the gate of said transistor N12 connected to said junction 'tail';

a p-channel transistor P8, a p-channel transistor P9, an n-channel transistor N11, and an n-channel transistor N10 all connected in series, in the sequence recited, between said voltage rail and said reference rail, the gate of said transistor P8 connected to the junction of said transistor P9 and said transistor N11, said junction labeled 'mout1', the gate of said transistor P9 connected to said junction 'tbiasp', the gate of said transistor N11 connected to said junction 'tbiasn', and the gate of said transistor N10 connected to said junction 'bbiasn', the junction between said transistor P8 and said transistor P9 labeled 'ndiff1', and the junction between said transistor N11 and said transistor N10 labeled 'pdiff1';

a p-channel transistor P7, a p-channel transistor P10, an n-channel transistor N9, and an n-channel transistor N8 all connected in series, in the sequence recited, between said voltage rail and said reference rail, the gate of said transistor P7 connected to said junction 'mout1', the gate of said transistor P10 connected to said junction 'tbiasp', the gate of said transistor N9 connected to said junction 'tbiasn', and the gate of said transistor N8 connected to said junction 'bbiasn', the junction between said transistor P7 and said transistor P10 labeled 'ndiff2', the junction between said transistor N9 and said transistor N8 labeled 'pdiff2', and said output 'out1' forming the junction between said transistor P10 and said transistor N9;

an input p-channel transistor P5 having its source-drain connected between said junctions 'tailp' and 'pdiff1', the substrate of said transistor P5 connected to said junction 'tailp', and its gate connected to said differential input 'inm';

an input p-channel transistor P6 having its source-drain connected between said junctions 'tailp' and 'pdiff2', the substrate of said transistor P6 connected to said junction 'tailp', and its gate connected to said differential input 'inm';

an input n-channel transistor N6 having its drain-source connected between said junctions 'ndiff1' and 'tailn', and its gate connected to said differential input 'inm';

an input n-channel transistor N7 having its drain-source connected between said junctions 'ndiff2' and 'tailn', and its gate connected to differential input 'inp';

a p-channel transistor P39, a p-channel transistor P38, an n-channel transistor N41, and an n-channel transistor N40 all connected in series, in the sequence recited, between said voltage rail and said reference rail, the gate of said transistor P39 connected to said junction 'bbiasp', the gate of said transistor P38 connected to said junction 'tbiasp', the gate of said transistor N41 connected to said junction 'tbiasn', the gate of said transistor N40 connected to the junction between said transistor P38 and said transistor N41 labeled junction 'moutn', and the junction between said transistor N41 and said transistor N40 labeled 'ndr';

a p-channel transistor P36, a p-channel transistor P37, an n-channel transistor N39, and an n-channel transistor N38 all connected in series, in the sequence recited, between said voltage rail and said reference rail, the gate of said transistor P36 connected to said junction 'bbiasp', the gate of said transistor P37 connected to said junction 'tbiasp', the gate of said transistor N39 connected to said junction 'tbiasn', the gate of said transistor N38 connected to said junction 'moutn', and said output 'outn' forming the junction between said transistor P37 and said transistor N39;

a p-channel transistor P17, a p-channel transistor P16, an n-channel transistor N18, and an n-channel transistor N17 all connected in series, in the sequence recited, between said voltage rail and said reference rail, the gate of said transistor P17 connected to the junction of said transistor P16 and said transistor N18, said junction labeled 'moutp', the gate of said transistor P16 connected to said junction 'tbiasp', the gate of said transistor N18 connected to said junction 'tbiasn', and the gate of said transistor N17 connected to said junction 'bbiasn', and the junction between transistor N18 and transistor N17 labeled 'pdr';

a p-channel transistor P14, a p-channel transistor P15, an n-channel transistor N16, and an n-channel transistor N15 all connected in series, in the sequence recited, between said voltage rail and said reference rail, the gate of said transistor P14 connected to said junction 'moutp', the gate of said transistor P15 connected to said junction 'tbiasp', the gate of said transistor N16 connected to said junction 'tbiasn', and the gate of said transistor N15 connected to said junction 'bbiasn', and where said output 'outp' forms the junction between said transistor P15 and said transistor N16;

a p-channel transistor P40 having its source-drain connected between said voltage rail and said junction 'ndr', and the gate of said transistor P40 connected to said output 'out1'; and a p-channel transistor P41 having its source-drain connected between said voltage rail and said junction 'pdr', and the gate of said transistor P41 connected to said output 'out1'.

21. The circuit of claim 11, wherein said output stage comprises:

said p-channel output transistor, labeled P12, having a source-drain path, and a gate;

said n-channel output transistor, labeled N13, having a drain-source path, and a gate; and said p-channel output transistor, labeled P12, and said n-channel output transistor, labeled N13, connected in series between said voltage rail and said reference rail, said output 'out' forming the junction between said transistor P12 and said transistor N13, the gate of said transistor P12 connected to said output 'outp' of said control circuit, the gate of said transistor N13 connected to said output 'outn' of said control circuit, said first capacitor, labeled CCP, connected between said output 'outp' and said output 'out', said second capacitor, labeled CCN, connected between said output 'outn' and said output 'out', and said resistor, labeled RC, and said third capacitor, labeled CC, connected in series between said output 'out1' and said output 'out'.

22. The circuit of claim 11, wherein said internal feedback circuit comprises:

said p-channel transistors each having a source-drain path, and a gate;

said n-channel transistors each having a drain-source path, and a gate;

an input 'pgate' connected to said output 'outp' of said control circuit;

an input 'ngate' connected to said output 'outn' of said control circuit;

an input 'pbias' connected to said input 'bias' of said control circuit;

an input 'nbias' connected to said output 'biasn' of said control circuit;

an output 'fbp' connected to said junction 'moutp' of said control circuit;

an output 'fbn' connected to said junction 'moutn' of said control circuit;

a p-channel transistor P21 connected in series with n-channel transistor N22 between said voltage rail vdd and said reference rail vss, the gate of said transistor P21 connected to said input 'pbias', the gate of said transistor N22 connected to said input 'ngate', the junction between said transistor P21 and said transistor N22 labeled 'csn';

a p-channel transistor P20 connected in series with n-channel transistor N23 between said voltage rail and said reference rail, the gate of said transistor P20 connected to said input 'pgate', the gate of said transistor N23 connected to said input 'nbias', the junction between said transistor P20 and said transistor N23 labeled 'csp';

a p-channel transistor P25 connected in series with n-channel transistor N28 between said voltage rail and said reference rail, the gate of said transistor P25 connected to said input 'pbias', the gate of said transistor N28 connected to said input 'ngate', the junction between said transistor P25 and said transistor N28 labeled 'csn1';

a p-channel transistor P26 connected in series with n-channel transistor N27 between said voltage rail and said reference rail, the gate of said transistor P26 connected to said input 'pgate', the gate of said transistor N27 connected to said input 'nbias', the junction between said transistor P26 and said transistor N27 labeled 'csp1';

a p-channel transistor P31 connected in series with n-channel transistor N31 between said voltage rail and said reference rail, the gate of said transistor P31 connected to said input 'pbias', the gate of said transistor N31 connected to said junction 'csn1', the junction between said transistor P31 and said transistor N31 labeled 'csn2;' an n-channel transistor N32 connected between said junction 'csn1' and said reference rail, and the gate of said transistor N32 connected to said junction 'csn1';

a p-channel transistor P29 connected in series with n-channel transistor N33 between said voltage rail and said reference rail, the gate of said transistor P29 connected to said junction 'csp1', the gate of said transistor N33 connected to said input 'nbias', the junction between said transistor P29 and said transistor N33 labeled 'csp2';

a p-channel transistor P30 connected between said voltage rail and said junction 'csp1', and the gate of transistor P30 connected to said junction 'csp1';

a p-channel transistor P27 connected in series with n-channel transistor N25 between said voltage rail and said reference rail, the gate of said transistor P27 connected to said junction 'csp2', the gate of said transistor N25 connected to junction 'csn', said output 'fbn' forming the junction between said transistor P27 and said transistor N25;

a p-channel transistor P28 connected between said voltage rail and said junction 'csp2', and the gate of transistor P28 connected to said junction 'csp2';

an n-channel transistor N24 connected between said junction 'csn' and said reference rail, and the gate of said transistor N24 connected to said junction 'csn';

a p-channel transistor P23 connected in series with n-channel transistor N30 between said voltage rail and said reference rail, the gate of said transistor P23 connected to said junction 'csp', the gate of said transistor N30 connected to said junction 'csn2', said output 'fbp' forming the junction between said transistor P23 and said transistor N30;

a p-channel transistor P22 connected between said voltage rail and said junction 'csp', and the gate of said transistor P22 connected to said junction 'csp'; and an n-channel transistor N29 connected between said junction 'csn2' and said reference rail, and the gate of said transistor N29 connected to said junction 'csn2'.

* * * * *